United States Patent
Cheng et al.

(10) Patent No.: US 8,878,302 B2
(45) Date of Patent: Nov. 4, 2014

(54) SEMICONDUCTOR DEVICE HAVING SIGE SUBSTRATE, INTERFACIAL LAYER AND HIGH K DIELECTRIC LAYER

(71) Applicant: Taiwan Semiconductor Manufacturing Company, Ltd., Hsin-Chu (TW)

(72) Inventors: Chao-Ching Cheng, Hsin-Chu (TW);
Ji-Yin Tsai, Zhudong Township (TW);
Cheng-Hsien Wu, Hsin-Chu (TW);
Chih-Hsin Ko, Fongshan (TW);
Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/706,081

(22) Filed: Dec. 5, 2012

(65) Prior Publication Data
US 2014/0151819 A1    Jun. 5, 2014

(51) Int. Cl.
*H01L 21/70* (2006.01)
*H01L 29/66* (2006.01)
*H01L 29/78* (2006.01)

(52) U.S. Cl.
CPC .......... *H01L 29/66477* (2013.01); *H01L 29/78* (2013.01)
USPC ............................. 257/369; 257/411; 438/285

(58) Field of Classification Search
USPC .................. 257/351, 369, 372, 411, E21.634, 257/E21.632
See application file for complete search history.

(56) References Cited

U.S. PATENT DOCUMENTS

| | | | |
|---|---|---|---|
| 7,952,150 B1* | 5/2011 | Wohlmuth | 257/392 |
| 2004/0137685 A1 | 7/2004 | Lochtefeld et al. | |
| 2007/0178634 A1* | 8/2007 | Jung et al. | 438/199 |
| 2010/0327366 A1* | 12/2010 | Manabe et al. | 257/369 |

FOREIGN PATENT DOCUMENTS

JP    2006505116    2/2006

OTHER PUBLICATIONS

Minjoo L. Lee, Chris W. Leitz, Zhiyuan Cheng, Dimitri A. Antoniadis, and E.A. Fitzgerald; Applied Physics Letter, vol. 79, No. 20. "Strained Ge channel p-type metal-oxide-semiconductor field-effect transistors grown on Si1-xGex/Si virtual substrates." 2001.*

* cited by examiner

*Primary Examiner* — Yu-Hsi D Sun
*Assistant Examiner* — Christina Sylvia
(74) *Attorney, Agent, or Firm* — Slater & Matsil, L.L.P.

(57) ABSTRACT

The invention relates to integrated circuit fabrication, and more particularly to a semiconductor device with an interfacial layer. An exemplary structure for a semiconductor device comprises a $Si_{1-x}Ge_x$ substrate, wherein the x is greater than 0.4; a Si layer over the $Si_{1-x}Ge_x$ substrate; and a gate structure disposed over the Si layer, wherein the gate structure comprises a dielectric portion and an electrode portion that is disposed over the dielectric portion; wherein the dielectric portion comprises a layer of III-V material on the Si layer and a high-k dielectric layer adjacent to the electrode portion.

20 Claims, 6 Drawing Sheets

SEMICONDUCTOR DEVICE HAVING SIGE SUBSTRATE, INTERFACIAL LAYER AND HIGH K DIELECTRIC LAYER

TECHNICAL FIELD

The disclosure relates to integrated circuit fabrication, and more particularly to a semiconductor device with an interfacial layer.

BACKGROUND

The semiconductor integrated circuit (IC) industry has experienced rapid growth. Technological advances in IC materials and design have produced generations of ICs where each generation has smaller and more complex circuits than the previous generation. As the dimensions of transistors decrease, the thickness of the gate dielectric layer must be reduced to maintain performance with the decreased gate length. However, in order to reduce gate leakage, high dielectric constant (high-k) gate dielectric layers are used which allow lesser physical thicknesses while maintaining the same effective thickness, such as would be provided by a gate dielectric layer used in future technology nodes. The gate dielectric layer further comprises an interfacial layer to reduce damage between the high-k gate dielectric layer and a silicon substrate.

However, there are challenges to implement such features and processes in complementary metal-oxide-semiconductor (CMOS) fabrication. For example, it is difficult to satisfy a threshold voltage requirement for a semiconductor device if the interfacial layer forms a low-quality interface with a high-density of defects. As the gate length and spacing between devices decrease, these problems are exacerbated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
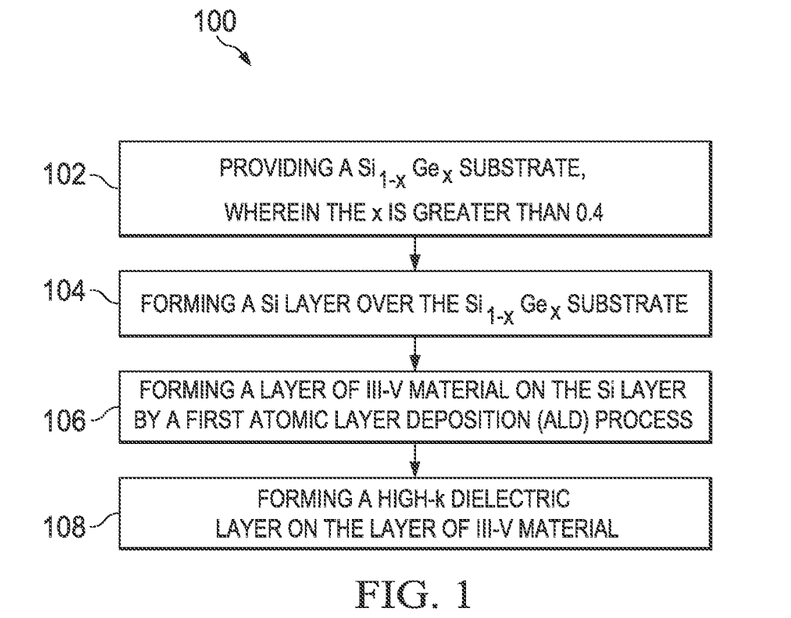
FIG. 1 is a flowchart illustrating a method of fabricating an interfacial layer of a semiconductor device according to various aspects of the present disclosure.

Referring to FIG. 1, illustrated is a flowchart of a method 100 of fabricating an interfacial layer of a semiconductor device according to various aspects of the present disclosure. The method 100 begins with step 102 in which a $Si_{1-x}Ge_x$ substrate is provided, wherein the x is greater than 0.4. The method 100 continues with step 104 in which a Si layer is formed over the $Si_{1-x}Ge_x$ substrate. The method 100 continues with step 106 in which a layer of III-V material is formed on the Si layer by a first atomic layer deposition (ALD) process. The method 100 continues with step 108 in which a high-k dielectric layer is formed on the layer of III-V material. The discussion that follows illustrates embodiments of semiconductor devices that can be fabricated according to the method 100 of FIG. 1.

FIGS. 2-10 are schematic cross-sectional views of a semiconductor device 200 comprising an interfacial layer 214 at various stages of fabrication according to various aspects of the present disclosure. As employed in the present disclosure, the term semiconductor device 200 refers to a planar metal-oxide-semiconductor field effect transistor (MOSFET). In some alternative embodiments, the term semiconductor device 200 refers to a fin field effect transistor (FinFET). The FinFET refers to any fin-based, multi-gate transistor. Other transistor structures and analogous structures are within the contemplated scope of this disclosure. The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 10 are simplified for a better understanding of the concepts of the present disclosure. For example, although the figures illustrate the semiconductor device 200, it is understood the IC may comprise a number of other devices comprising resistors, capacitors, inductors, and/or fuses, etc.

Figure 2:
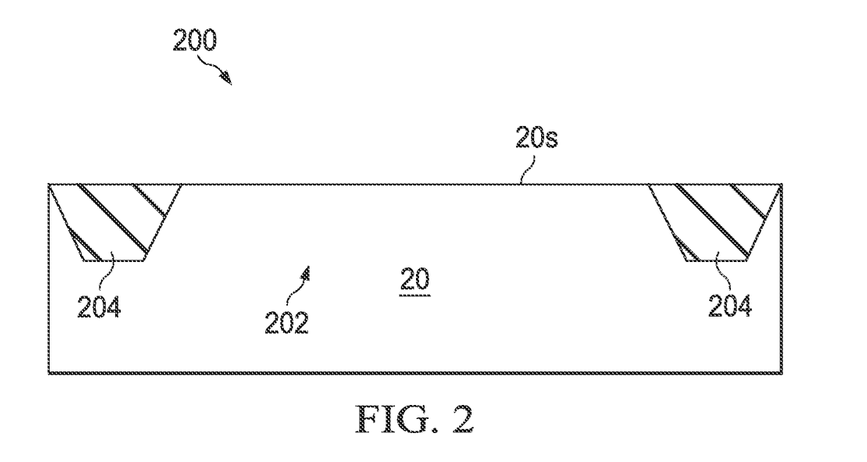
FIGS. 2-11 are schematic cross-sectional views of a semiconductor device comprising an interfacial layer at various stages of fabrication according to various aspects of the present disclosure.

Referring to FIG. 2 and step 102 in FIG. 1, a $Si_{1-x}Ge_x$ substrate 20 is provided, wherein the x is greater than 0.4. In at least one embodiment, the substrate 20 includes a crystalline $Si_{1-x}Ge_x$ substrate (e.g., wafer). In some embodiments, the substrate 20 may include an epitaxial layer (i.e., $Si_{1-x}Ge_x$ layer) on a silicon substrate. In some embodiments, the substrate 20 may include a silicon-on-insulator (SOI) structure having an epitaxial layer (i.e., $Si_{1-x}Ge_x$ layer) on silicon.

Further, the substrate 20 comprises active regions 202 and isolation regions 204. The active regions 202 may include various doping configurations depending on design requirements. In some embodiments, the active regions 202 may be doped with p-type or n-type dopants. For example, the active regions 202 may be doped with p-type dopants, such as boron or $BF_2$; n-type dopants, such as phosphorus or arsenic; and/or combinations thereof. The active regions 202 may be configured for an n-type FinFET or planar MOSFET, or alternatively configured for a p-type FinFET or planar MOSFET.

The isolation regions 204 may be formed on the substrate 20 to isolate the active region 202 with other active regions (not shown) on the substrate 20. The isolation regions 204 may utilize isolation technology, such as local oxidation of silicon (LOCOS) or shallow trench isolation (STI), to define and electrically isolate the various active regions 202. In the present embodiment, the isolation region 204 includes a STI. The isolation regions 204 may comprise silicon oxide, silicon nitride, silicon oxynitride, fluoride-doped silicate glass (FSG), a low dielectric constant (low-k) dielectric material, other suitable materials, and/or combinations thereof. The isolation regions 204, and in the present embodiment, the STI, may be formed by any suitable process. As one example, the formation of the STI may include patterning the semiconductor substrate 20 by a conventional photolithography process, etching a trench in the substrate 20 (for example, by using a dry etching, wet etching, and/or plasma etching process), and filling the trench (for example, by using a chemical vapor deposition (CVD) process) with a dielectric material. In some embodiments, the filled trench may have a multi-layer structure such as a thermal oxide liner layer filled with silicon nitride or silicon oxide.

In order to integrate high dielectric constant (high-k) dielectric layers into current CMOS schemes, an interfacial layer composed of an oxide or oxy-nitride is formed between a substrate and a high-k dielectric layer. The function of the interfacial layer is to: (i) passivate dangling bonds at a surface of the substrate and form a high-quality interface with a low-density of defects; (ii) create a barrier against interfacial reactions and diffusion into the channel area of a semiconductor device; (iii) separate the high-k dielectric layer from the substrate surface in order to remove charge/traps in the high-k dielectric layer from the interface; and (iv) prevent diffusion of dopants and impurities through the high-k dielectric layer.

However, since substrate material changes from Si to $Si_{1-x}Ge_x$ for performance enhancement, the material change makes the conventional interfacial layer form a low-quality interface with a high-density of defects, if the conventional interfacial layer cannot efficiently passivate dangling bonds at a surface of the $Si_{1-x}Ge_x$ substrate (e.g., the x is greater than 0.4) and/or remove charge/traps in the high-k dielectric layer from the interface. Thus, it is difficult to achieve a predetermined threshold voltage of a semiconductor device if the interfacial layer forms a low-quality interface with a high-density of defects.

Accordingly, the processing discussed below with reference to FIGS. 3-5 may fabricate an interfacial layer of III-V material to form a high-quality interface with a low-density of defects. Problems associated with a high-density of defects from the interfacial layer may be avoided, or significantly reduced. Thus, Applicant's method may achieve desired device performance characteristics, such as threshold voltage.

Figure 3:
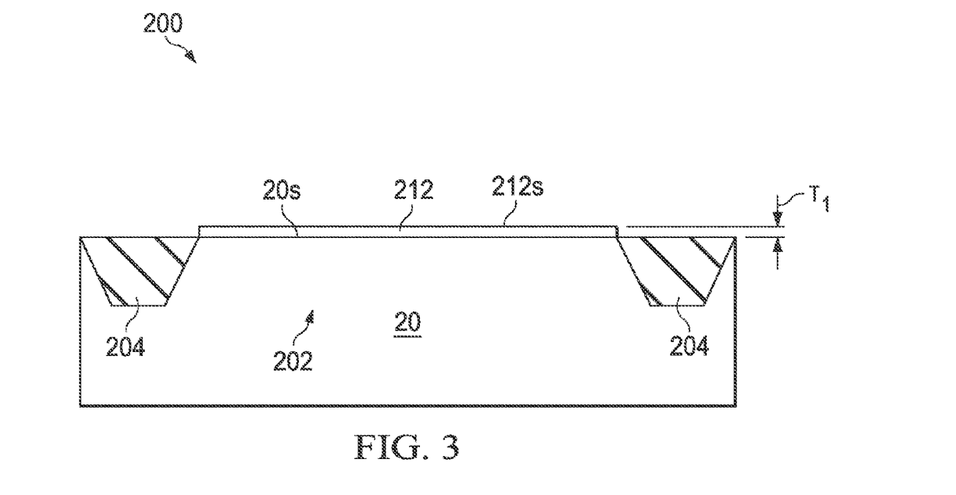

For fabricating one embodiment of an interfacial layer of III-V material 214 of the semiconductor device 200 (shown in FIG. 4), the structure in FIG. 3 is produced by forming a Si layer 212 over the $Si_{1-x}Ge_x$ substrate 20 (step 104 in FIG. 1). A difference between a lattice constant of the Si layer 212 and a lattice constant of the interfacial layer of III-V material 214 is less than a difference between a lattice constant of the $Si_{1-x}Ge_x$ substrate 20 and a lattice constant of the interfacial layer of III-V material 214, which reduces density of defects, and hence improves the performance of the resulting semiconductor device 200. In some embodiments, a thickness $t_1$ of the Si layer 212 is from about 1 angstrom to 10 angstroms.

In the depicted embodiment, a pre-clean of the exposed surfaces of the intermediate semiconductor device 200 structure in FIG. 2 may be needed to remove a native oxide on a surface 20s of the $Si_{1-x}Ge_x$ substrate 20. This is accomplished via a diluted hydrofluoric acid (DHF) treatment or a vapor hydrofluoric acid (VHF) treatment for a suitable time.

Then, the Si layer 212 is selectively grown by a low-pressure CVD (LPCVD) process over the $Si_{1-x}Ge_x$ substrate 20. In some embodiments, the LPCVD process is performed at a temperature of about 400 to about 600° C., using $SiH_2Cl_2$, HCl, and $H_2$ as reaction gases, wherein the flow rate of the $H_2$ is in the range of about 5 slm to about 30 slm, the flow rate of $SiH_2Cl_2$ is in the range of about 50 sccm to about 300 sccm, and the flow rate of HCl is in the range of about 50 sccm to about 200 sccm.

Figure 4:
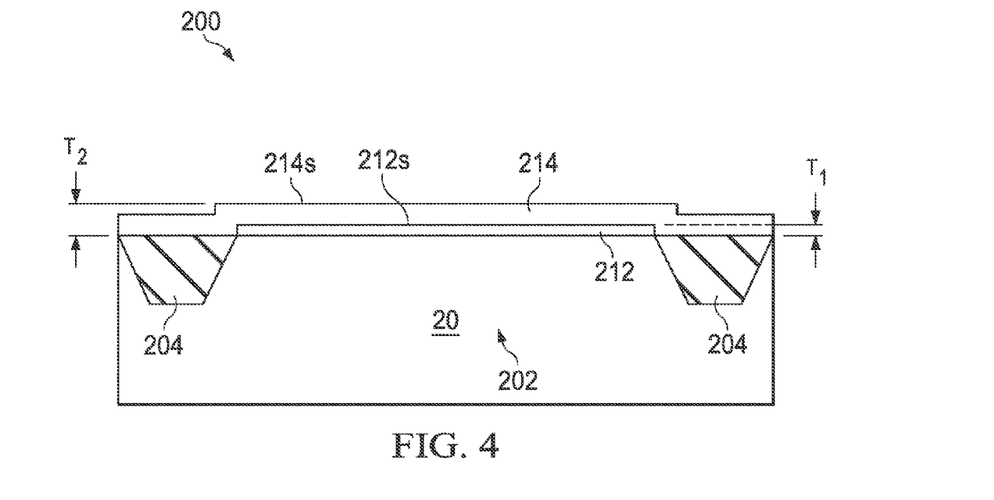

Referring to FIG. 4 and step 106 in FIG. 1, after the formation of the Si layer 212 over the $Si_{1-x}Ge_x$ substrate 20, the structure in FIG. 4 is produced by forming the interfacial layer of III-V material 214 on the Si layer 212 by a first atomic layer deposition (ALD) process. In some embodiments, the interfacial layer of III-V material 214 may be formed by CVD, physical vapor deposition (PVD), or other suitable technique. In at least one embodiment, the III-V material 214 comprises AlP. In another embodiment, the III-V material 214 comprises AlN, AlAs, InP, InN, or InAs.

In the present embodiment, a pre-clean of the exposed surfaces of the intermediate semiconductor device 200 structure in FIG. 3 may be needed to remove a native oxide on a top surface 212s of the Si layer 212. This is accomplished via a diluted hydrofluoric acid (DHF) treatment or a vapor hydrofluoric acid (VHF) treatment for a suitable time.

Then, by providing alternating pulses of a group-III precursor and a group-V precursor to a reaction chamber, the first ALD process is performed to form the interfacial layer of III-V material 214 on the Si layer 212. Each pulse of reactants saturates the surface in a self-limiting manner.

An exemplary first ALD process of forming the interfacial layer of III-V material 214 comprises the following steps. First, the $Si_{1-x}Ge_x$ substrate 20 is loaded into a reaction chamber. Then, a pulse of a group-V precursor is injected into the reaction chamber at a temperature of about 500° C. to about 600° C. and under a pressure of about 250 torr to about 350 torr for a first period of time. Here, the group-V precursor of the first ALD process comprises $PH_3$, $NH_3$, or $AsH_3$.

As the group-V precursor is injected into the reaction chamber, a chemi-sorption layer of the group-V precursor is formed on the top surface 212s of the Si layer 212. Then, any residual group-V precursor is discharged from the reaction chamber for a second period of time. To more effectively discharge the residual group-V precursor from the reaction chamber, purge gas may be injected into the reaction chamber during this purging period, wherein the purge gas may include a substantially inert gas such as $N_2$, Ar, He, or similar inert gases.

After discharging the residual group-V precursor from the reaction chamber, a pulse of a group-III precursor is injected into the reaction chamber under a pressure of about 3 torr to about 4 torr for a third period of time. Here, the a group-III precursor of the first ALD process comprises $Al(CH_3)_3$, $Al(CH_3CH_2)_3$, or $In(CH_3)_3$. The group-III precursor reacts with the chemi-sorption layer of the group-V precursor at a temperature of about 200° C. to about 300° C. As a result, an atomic layer of the interfacial layer of III-V material 214 is formed on the Si layer 212.

Then, any residual group-III precursor is discharged from the reaction chamber for a fourth period of time. To more effectively discharge the residual group-III precursor from the reaction chamber during this second purging period, a substantially inert gas such as $N_2$, Ar, He, or the like may be injected into the reaction chamber.

Normally, the first ALD process comprises a sequence of ALD cycles, i.e., the first through fourth time periods, as described above, during which each of the group-III precursor and the group-V precursor is alternately injected into and thereafter discharged from the reaction chamber, when taken together are regarded as one deposition or layer formation cycle. By repeating this cycle multiple times, the interfacial layer of III-V material 214 with a desired thickness is thereby formed. In at least one embodiment, the interfacial layer of III-V material 214 has a thickness $t_2$ greater than 3 angstroms. In an alternative embodiment, the thickness $t_2$ of the interfacial layer of III-V material 214 is from about 3 angstroms to 10 angstroms. Further, an anneal process is optionally performed at a temperature of about 400° C. to about 600° C. to improve interfacial layer performance.

Figure 5:
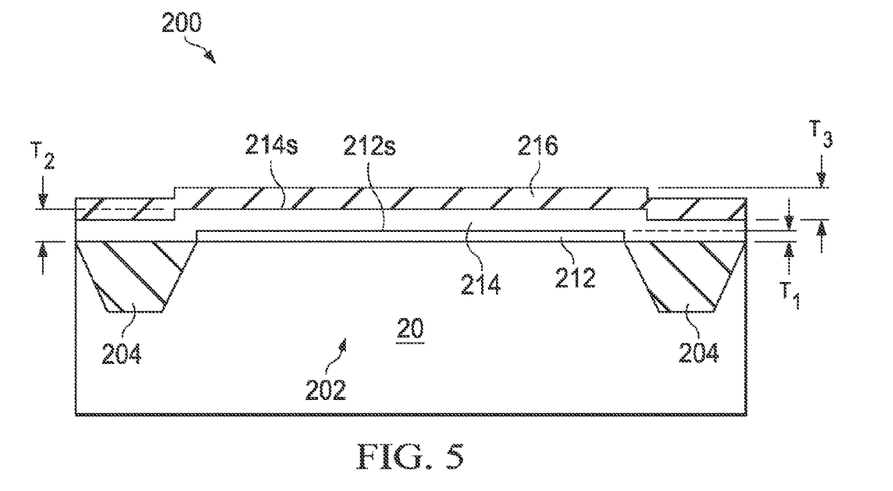

Referring to FIG. 5 and step 108 in FIG. 1, subsequent to the formation of the interfacial layer of III-V material 214 on the Si layer 212, the structure in FIG. 5 is produced by forming a high-k dielectric layer 216 on the interfacial layer of III-V material 214 by a second ALD process. A high-k dielectric material is defined as a dielectric material with a dielectric constant greater than that of $SiO_2$. In some embodiments, the high-k dielectric layer 216 is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, the high-k dielectric layer 216 comprises hafnium oxide.

An exemplary second ALD process of forming the high-k dielectric layer 216 comprises the following steps. First, the $Si_{1-x}Ge_x$ substrate 20 is loaded into a reaction chamber. Then, a pulse of a metal precursor is injected into the reaction chamber loaded with the $Si_{1-x}Ge_x$ substrate 20 for a fifth period of time. Here, the metal precursor of the second ALD process comprises metal halide. In one embodiment, the metal halide comprises a metal selected from Li, Be, Mg, Ca, Sr, Sc, Y, Zr, Hf, Al, La, Ce, Pr, Nd, Sm, Eu, Gd, Tb, Dy, Ho, Er, Tm, Yb, and Lu. As depositing the hafnium oxide, the metal halide comprises $HfCl_4$.

As the metal precursor is injected into the reaction chamber, a chemi-sorption layer of the metal precursor is formed on top surface 214s of the interfacial layer of III-V material 214. Then, any residual metal precursor is discharged from the reaction chamber for a sixth period of time. To more effectively discharge the residual metal precursor from the reaction chamber, purge gas may be injected into the reaction chamber during this purging period, wherein the purge gas may include a substantially inert gas such as $N_2$, Ar, He, or similar inert gases.

Figure 11:
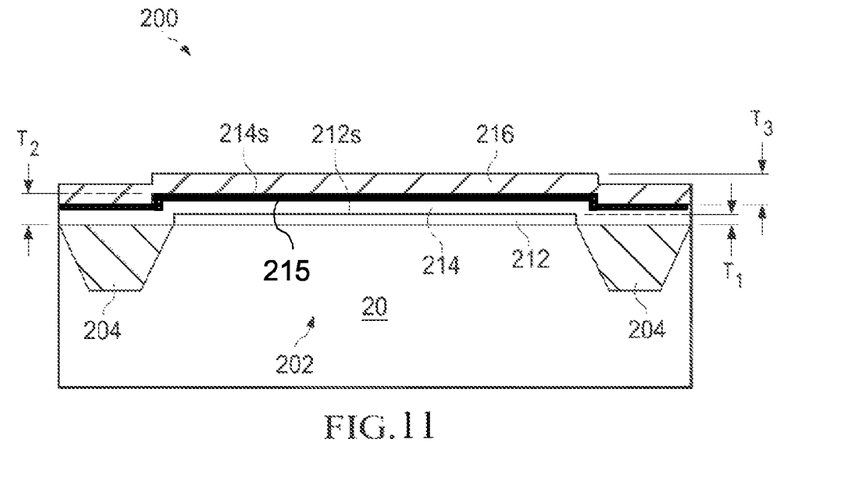

After discharging the residual metal precursor from the reaction chamber, a pulse of an oxygen precursor is injected into the reaction chamber for a seventh period of time. Here, the oxygen precursor comprises $O_2$, $O_3$, or $H_2O$. The oxygen precursor reacts with the chemi-sorption layer of the metal precursor at a temperature of about 250° C. to 325° C. As a result, an atomic layer of the high-k dielectric layer 216 is formed on the interfacial layer of III-V material 214. In some embodiments, an amorphous layer 215 comprising oxygen and the III-V material is formed between the layer of III-V material 214 and the high-k dielectric layer 216, as illustrated in FIG. 11

Then, any residual oxygen precursor is discharged from the reaction chamber for an eighth period of time. To more effectively discharge the residual oxygen precursor from the reaction chamber during this purging period, a substantially inert gas such as $N_2$, Ar, He, or the like may be injected into the reaction chamber.

Normally, the second ALD process comprises a sequence of ALD cycles, i.e., the fifth through eighth time periods, as described above, during which each of the metal (Me) precursor and the oxygen precursor is alternately injected into and thereafter discharged from the reaction chamber, when taken together are regarded as one deposition or layer formation cycle. By repeating this cycle multiple times, the high-k dielectric layer 216 with a desired thickness is thereby formed. In at least one embodiment, the high-k dielectric layer 214 has a thickness $t_3$ greater than 3 angstroms. In an alternative embodiment, the thickness $t_3$ of the high-k dielectric layer 214 is from about 3 angstroms to 30 angstroms. In some embodiments, a ratio ($t_3/t_2$) of a thickness $t_3$ of the high-k dielectric layer 216 to a thickness $t_2$ of the layer of III-V material 214 is from about 1 to about 10.

The process steps up to this point have provided the substrate 20 having the layer of III-V material 214 that is formed to maintain high-quality interface with a low-density of defects even when the manufacturing process evolved to a more compact technology. After the steps shown in FIGS. 2-5 have been performed, then transistor fabrication may be completed using standard CMOS fabrication techniques. For example, FIGS. 6-10 illustrate further processing performed to fabricate the semiconductor device 200 using a "gate last" CMOS process.

Figure 6:
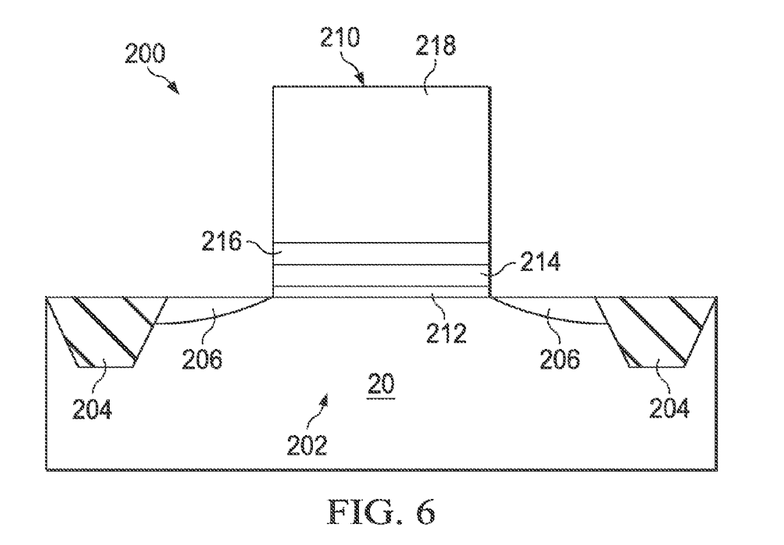

Referring now to FIG. 6, a dummy gate electrode layer 218 may be formed over the high-k gate dielectric layer 216. In some embodiments, the dummy gate electrode layer 218 may comprise a single layer or multilayer structure. In the present embodiment, the dummy gate electrode layer 218 may comprise poly-silicon. Further, the dummy gate electrode layer 218 may be doped poly-silicon with the uniform or gradient doping. The dummy gate electrode layer 218 may have a thickness in the range of about 30 nm to about 60 nm. The dummy gate electrode layer 218 may be formed using a LPCVD process.

Then, a layer of photoresist (not shown) is formed over the dummy gate electrode layer 218 by a suitable process, such as spin-on coating, and patterned to form a patterned photoresist feature by a proper lithography patterning method. A width of the patterned photoresist feature is in the range of about 5 to 30 nm. The patterned photoresist feature can then be transferred using a dry etching process to the underlying layers (i.e., the dummy gate electrode layer 218, high-k gate dielectric layer 216, interfacial layer of III-V material 214, and/or Si layer 212) to form a dummy gate structure 210. The photoresist layer may be stripped thereafter.

Still referring to FIG. 6, lightly doped source/drain (LDD) region 206 may be formed in the active region 202 of the substrate 20. The LDD regions 206 may be formed in the active region 202 by one or more ion implantation processes. The doping species may depend on the type of device being fabricated, such as an n-type or p-type device. For example, the LDD regions 206 may doped with p-type dopants, such as boron or $BF_2$; n-type dopants, such as phosphorus or arsenic; and/or combinations thereof. The LDD regions 206 may comprise various doping profiles. The LDD regions 206 may be aligned with an outer edge of the dummy gate structure 210 following the ion implantation process.

Figure 7:
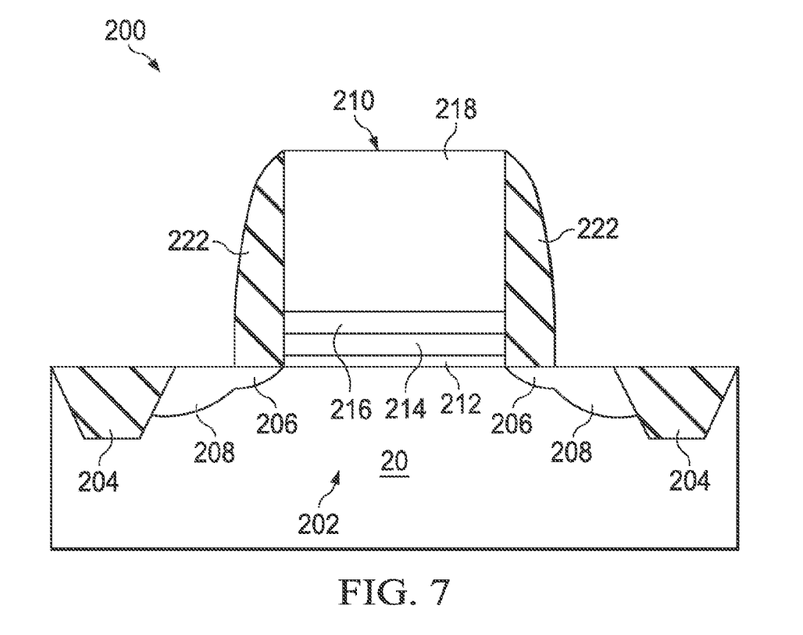

Referring to FIG. 7, a dielectric layer, such as silicon nitride or silicon oxynitride, is formed to surround the dummy gate structure 210. The dielectric layer may be formed by plasma deposition at a temperature less than 400° C. and at a pressure of about 200 mTorr to about 1 Torr, using $SiH_4$, $NH_3$ and/or $N_2O$ as reaction gases. Then, an anisotropic etching is performed on the dielectric layer to form a pair of gate spacers 222 on two sides of the dummy gate structure 210. The pair of gate spacers 222 comprises a thickness in the range of about 0.5 nm to about 5 nm. The pair of gate spacers 222 may comprise a multilayer structure.

Still referring to FIG. 7, the pair of gate spacers 222 may be used to offset source/drain (S/D) regions 208. The S/D regions 208 may be formed in the active region 202 of the substrate 20 by one or more ion implantation processes. The doping species may depend on the type of device being fabricated, such as an n-type or p-type device. For example, the S/D regions 208 may doped with p-type dopants, such as boron or $BF_2$; n-type dopants, such as phosphorus or arsenic; and/or combinations thereof. The S/D regions 208 may comprise various doping profiles, and the S/D regions 208 may be aligned with an outer edge of the spacers 222 following the ion implantation process. The S/D regions 208 may further include raised S/D regions in some embodiments. Also, one or more contact features (e.g., silicide regions) may be formed on the S/D regions 208 by a self-aligned silicidation process.

Figure 8:
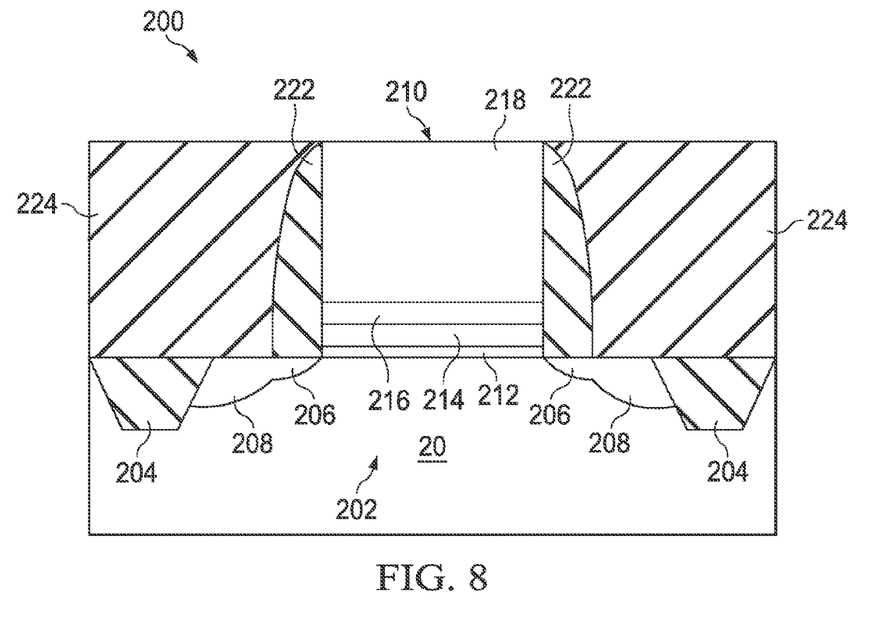

Referring to FIG. 8, an inter-layer dielectric (ILD) layer 224 may be formed over the substrate 20, including over the dummy gate structure 210. The ILD layer 224 may comprise a dielectric material. The dielectric material may comprise silicon oxide, spin-on glass (SOG), fluorinated silica glass (FSG), carbon doped silicon oxide (e.g., SiCOH), Black Diamond® (Applied Materials of Santa Clara, Calif.), other suitable dielectric materials, and/or combinations thereof. In some embodiments, the ILD layer 224 may include a high density plasma (HDP) dielectric material and/or a high aspect ratio process (HARP) dielectric material. In the present embodiment, the ILD layer 224 comprises a thickness in the range of about 4000 Å to about 8000 Å. It is understood that the ILD layer 224 may comprise one or more dielectric materials and/or one or more dielectric layers.

Subsequently, the ILD layer 224 may be planarized by a chemical-mechanical-polishing (CMP) process until a top portion of the dummy gate structure 210 is exposed. The CMP process may have a high selectivity to provide a substantially planar surface for the dummy gate structure 210, the pair of gate spacers 222, and ILD layer 224. In the present embodiment, the dummy gate structure 210 may be surrounded with dielectric comprising the pair of gate spacers 222 and ILD layer 224.

Figure 9:
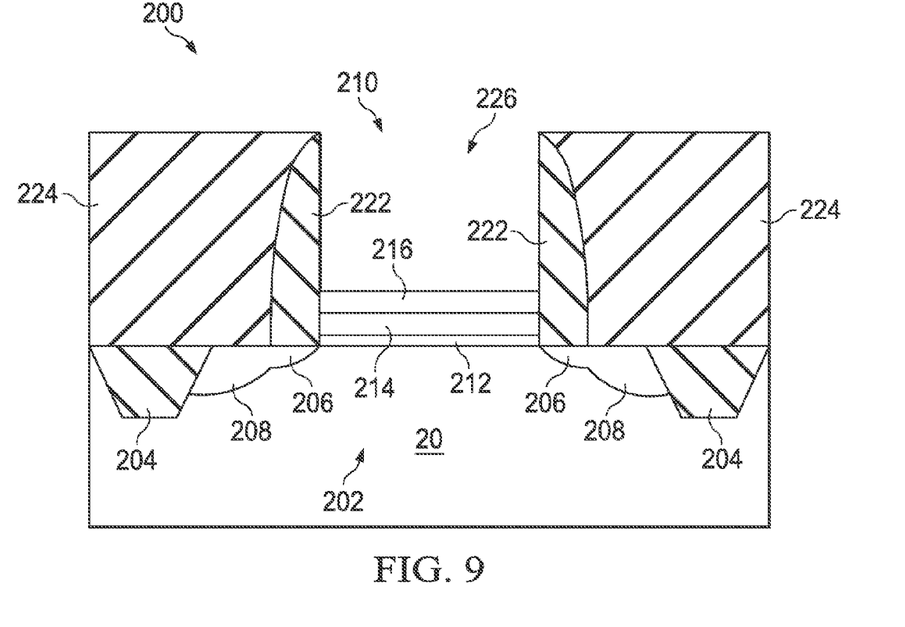

Referring to FIG. 9, the dummy gate electrode layer 218 may be removed from the dummy gate structure 210 to form an opening 226 in the pair of gate spacers 222 by any suitable process. The dummy gate electrode layer 218 may be removed using a wet etch and/or a dry etch process. In at least one embodiment, the wet etch process for dummy poly-silicon gate electrode layer 218 includes exposure to a hydroxide solution containing ammonium hydroxide, diluted HF, deionized water, and/or other suitable etchant solutions. In other embodiments, the dry etch process for dummy poly-silicon gate electrode layer 218 may be performed under a source power of about 650 to 800 W, a bias power of about 100 to 120 W, and a pressure of about 60 to 200 mTorr, using $Cl_2$, HBr and He as etching gases.

Figure 10:
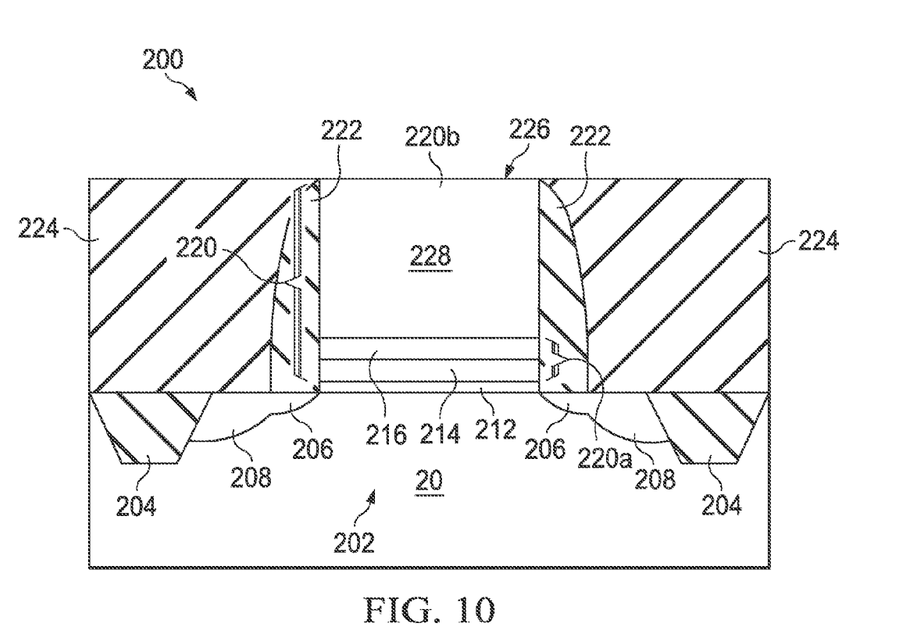

Referring to FIG. 10, a metal gate electrode layer 228 may be formed to completely fill the opening 226. In some embodiments, the metal gate electrode layer 228 comprises Al, Cu, Ru, Ag, TiAl, TiAlN, TiN, TiCN, TaN, TaCN, WN, or WCN. The metal gate electrode layer 228 may be formed by CVD, PVD, plating, ALD, or other suitable technique. And then, a CMP process may be performed to planarize the metal gate electrode layer 228. The CMP process may remove a portion of the metal gate electrode layer 228 until the top surface of the ILD layer 224 is reached.

In the present embodiment, the metal gate electrode layer 228, the high-k gate dielectric layer 216, and the interfacial layer of III-V material 214 are combined and referred as a gate structure 220. In other words, the gate structure 220 disposed over the Si layer 212 comprises a dielectric portion 220a (i.e., the high-k dielectric layer 216 and the interfacial layer of III-V material 214) and an electrode portion 220b (i.e., the metal gate electrode layer 228) that is disposed over the dielectric portion 220a, wherein the dielectric portion 220a comprises a layer of III-V material 214 on the Si layer 212 and a high-k dielectric layer 216 adjacent to the electrode portion 220b.

Then, subsequent processes, including interconnect processing, must be performed after forming the metal gate electrode layer 228 of the gate structure 220 to complete the semiconductor device 200 fabrication.

In accordance with embodiments, a semiconductor device comprises a $Si_{1-x}Ge_x$ substrate, wherein the x is greater than 0.4; a Si layer over the $Si_{1-x}Ge_x$ substrate; and a gate structure disposed over the Si layer, wherein the gate structure comprises a dielectric portion and an electrode portion that is disposed over the dielectric portion; wherein the dielectric portion comprises a layer of III-V material on the Si layer and a high-k dielectric layer adjacent to the electrode portion.

In accordance with another embodiments, a method for fabricating a gate dielectric layer comprises providing a $Si_{1-x}Ge_x$ substrate, wherein the x is greater than 0.4; forming a Si layer over the $Si_{1-x}Ge_x$ substrate; forming a layer of III-V material on the Si layer by a first atomic layer deposition (ALD) process, and forming a high-k dielectric layer on the layer of III-V material.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
   a $Si_{1-x}Ge_x$ substrate, wherein the x is greater than 0.4;
   a Si layer over the $Si_{1-x}Ge_x$ substrate; and
   a gate structure disposed over the Si layer,
   wherein the gate structure comprises a dielectric portion that is dielectric from a topmost surface of the dielectric portion through to a bottommost surface of the dielectric portion and an electrode portion that is conductive from a topmost surface of the electrode portion to a bottommost surface of the electrode portion and that is disposed over the dielectric portion;
   wherein the dielectric portion comprises a layer of III-V material on the Si layer and a high-k dielectric layer adjacent to-the electrode portion wherein the III-V material is interjacent the high-k dielectric layer and the Si layer.

2. The semiconductor device of claim 1, wherein a thickness of the Si layer is from about 1 angstrom to 10 angstroms.

3. The semiconductor device of claim 1, wherein a thickness of the layer of III-V material is from about 3 angstroms to 10 angstroms.

4. The semiconductor device of claim 1, wherein the III-V material comprises AlP.

5. The semiconductor device of claim 1, wherein the III-V material comprises AN, AlAs, InP, InN, or InAs.

6. The semiconductor device of claim 1 further comprises:
an amorphous layer comprising oxygen and the III-V material between the layer of III-V material and the high-k dielectric layer.

7. The semiconductor device of claim 1, the high-k dielectric layer is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

8. The semiconductor device of claim 1, wherein the high-k dielectric layer comprises hafnium oxide.

9. The semiconductor device of claim 1, wherein a ratio of a thickness of the high-k dielectric layer to a thickness of the layer of III-V material is from about 1 to about 10.

10. A method for fabricating a semiconductor device, comprising:
providing a $Si_{1-x}Ge_x$ substrate, wherein the x is greater than 0.4;
forming a Si layer over the $Si_{1-x}Ge_x$ substrate;
forming a dielectric portion of a gate structure over the Si layer, the dielectric portion being dielectric from a topmost surface of the dielectric portion through to a bottommost surface of the dielectric portion, by
forming a dielectric layer of III-V material on the Si layer by a first atomic layer deposition (ALD) process; and
forming a high-k dielectric layer on the dielectric layer of III-V material.

11. The method of claim 10, wherein a group-V precursor of the first ALD process comprises $PH_3$, $NH_3$, or $AsH_3$.

12. The method of claim 10, wherein a group-III precursor of the first ALD process comprises $Al(CH_3)_3$, $Al(CH_3CH_2)_3$, or $In(CH_3)_3$.

13. The method of claim 10, wherein the first ALD process comprises injecting a group-V precursor into a reaction chamber at a temperature of about 500° C. to about 600° C.

14. The method of claim 10, wherein the first ALD process comprises injecting a group-V precursor into a reaction chamber under a pressure of about 250 torr to about 350 torr.

15. The method of claim 10, wherein the first ALD process comprises injecting a group-III precursor into a reaction chamber at a temperature of about 200° C. to about 300° C.

16. The method of claim 10, wherein the first ALD process comprises injecting a group-III precursor into a reaction chamber under a pressure of about 3 torr to about 4 torr.

17. The method of claim 10, wherein the step of forming a high-k dielectric layer is performed using a second ALD process.

18. The method of claim 17, wherein a metal precursor of the second ALD process comprises metal halide.

19. The method of claim 18, the metal halide comprises a metal selected from Li, Be, Mg, Ca, Sr, Sc, Y, Zr, Hf, Al, La, Ce, Pr, Nd, Sm, Eu, Gd, Tb, Dy, Ho, Er, Tm, Yb, and Lu.

20. The method of claim 17, wherein an oxygen precursor of the second ALD process comprises $O_2$, $O_3$, or $H_2O$.

* * * * *